(12) United States Patent
Chen

(10) Patent No.: US 10,651,250 B2
(45) Date of Patent: May 12, 2020

(54) DISPLAY PANEL AND METHOD FOR MANUFACTURING SAME

(71) Applicant: Wuhan China Star Optoelectronics Semiconductor Display Technology Co., Ltd., Wuhan (CN)

(72) Inventor: Caiqin Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/092,004

(22) PCT Filed: Aug. 7, 2018

(86) PCT No.: PCT/CN2018/099240
§ 371 (c)(1),
(2) Date: Oct. 8, 2018

(87) PCT Pub. No.: WO2020/000586
PCT Pub. Date: Jan. 2, 2020

(65) Prior Publication Data
US 2019/0393282 A1 Dec. 26, 2019

(30) Foreign Application Priority Data
Jun. 25, 2018 (CN) .......................... 2018 1 0658337

(51) Int. Cl.
*H01L 27/32* (2006.01)
*H01L 51/00* (2006.01)
(Continued)

(52) U.S. Cl.
CPC ...... *H01L 27/3246* (2013.01); *H01L 27/3248* (2013.01); *H01L 27/3258* (2013.01); *H01L 27/3262* (2013.01); *H01L 51/0018* (2013.01); *H01L 51/5209* (2013.01); *H01L 51/56* (2013.01); *H01L 21/0274* (2013.01);
(Continued)

(58) Field of Classification Search
CPC ............. H01L 27/3246; H01L 27/3258; H01L 27/3262; H01L 51/0018; H01L 27/3248; H01L 51/5209; H01L 51/56; H01L 27/1288; H01L 29/78645; H01L 27/1222;
(Continued)

(56) References Cited

U.S. PATENT DOCUMENTS

2005/0046342 A1* 3/2005 Park .................... H01L 27/3246
 311/504
2010/0044692 A1* 2/2010 Kim .................... H01L 51/5268
 257/40

FOREIGN PATENT DOCUMENTS

| CN | 1607879 | 4/2005 |
| CN | 105914223 | 8/2016 |
| CN | 106206620 | 12/2016 |

* cited by examiner

*Primary Examiner* — Karen Kusumakar
*Assistant Examiner* — Adam S Bowen

(57) ABSTRACT

A display panel and a method for manufacturing the same are provided. According to the present disclosure, one mask is used to form the planarization layer and the pixel defining layer, or to form the planarization layer, the pixel defining layer, and the spacer. Thus, each of the light-emitting units is disposed within the area covered by the anode, and light emitted from the light-emitting unit can be reflected by the anode and be focused. Therefore, the risk where display panel has color mixing problem is decreased, and the intensity of light emitted therefrom is enhanced.

9 Claims, 6 Drawing Sheets

(51) Int. Cl.
   *H01L 51/52* (2006.01)
   *H01L 51/56* (2006.01)
   *H01L 29/786* (2006.01)
   *H01L 27/12* (2006.01)
   *H01L 29/66* (2006.01)
   *H01L 21/027* (2006.01)

(52) U.S. Cl.
   CPC ...... *H01L 27/1222* (2013.01); *H01L 27/1288* (2013.01); *H01L 29/66757* (2013.01); *H01L 29/78645* (2013.01); *H01L 29/78675* (2013.01); *H01L 2227/323* (2013.01)

(58) Field of Classification Search
   CPC ......... H01L 2227/323; H01L 29/78675; H01L 21/0274; H01L 29/66757
   USPC .......................................................... 257/40
   See application file for complete search history.

DISPLAY PANEL AND METHOD FOR MANUFACTURING SAME

RELATED APPLICATIONS

This application is a National Phase of PCT Patent Application No. PCT/CN2018/099240 having International filing date of Aug. 7, 2018, which claims the benefit of priority of Chinese Patent Application No. 201810658337.X filed on Jun. 25, 2018. The contents of the above applications are all incorporated by reference as if fully set forth herein in their entirety.

FIELD AND BACKGROUND OF THE INVENTION

The present disclosure relates to the field of display, and more particularly to a display panel and a method for manufacturing same.

Among different types of flat panels, organic light-emitting diode (OLED) displays have outstanding properties, including being light weight, thin, self-illuminating, short response times, wide viewing angles, a wide color gamut, high brightness, and low power consumption. Thus, succeeding liquid crystal displays (LCDs), OLED displays have gradually become a third generation display technology. Compared to LCDs, OLED displays save more energy, are thinner, and have wider viewing angles, to which the LCDs cannot compete. Nevertheless, users are getting increasingly unsatisfied with resolution of displayed images, and a lot of challenges still exist for producing OLED displays that have high quality and high resolution.

OLED display devices are classified, according to driving mode, into two categories, including passive matrix OLED (PMOLED) and active matrix OLED (AMOLED), namely direct addressing thin-film transistor (TFT) and matrix addressing. Among them, AMOLED is of an active displaying type that has a high light-emitting efficiency, and is generally used for manufacturing high definition large-sized display devices.

Conventional AMOLED display panels generally have a top light-emitting structure. When a voltage is applied between anode and cathode thereof, light-emitting layer starts to emit light. The emitted light is reflected from anode first, and thereafter, because being assisted by resonant cavity, light emitted from cathode is enhanced. However, in the meanwhile, a portion of light is scattered to enter adjacent pixel, resulting in color mixing problems.

SUMMARY OF THE INVENTION

The present disclosure provides a display panel and a method for manufacturing the same, which solves the color mixing problem that exists in AMOLED display panels.

To solve the aforementioned problems, the present disclosure provides the following technical schemes.

The present disclosure provides a method for manufacturing a display panel, comprising:
a step S10 of providing a substrate;
a step S20 of forming a thin film transistor (TFT) layer on the substrate;
a step S30 of sequentially forming a planarization layer and a pixel defining layer, or sequentially forming the planarization layer, the pixel defining layer, and a spacer on the TFT layer, and using a multi-transmittance mask to perform exposure and development on the planarization layer and the pixel defining layer, or on the planarization layer, the pixel defining layer, and the spacer;
a step S40 of forming an anode layer, a light-emitting layer, and a cathode layer on the planarization layer and the pixel defining layer;
wherein the anode layer covers a portion of the planarization layer and a portion of the pixel defining layer, and the anode layer is connected to a source/drain electrode via a through-hole.

In the display panel of the present disclosure, the anode layer includes at least two anodes, and each of the anodes corresponds to a pixel unit of the display panel; and each of the anodes includes a first portion contacting the planarization layer and a second portion contacting the pixel defining layer.

In the display panel of the present disclosure, an angle $\theta$ between the first portion and the second portion is between 0 degrees and 90 degrees.

In the display panel of the present disclosure, each of the anodes is disposed between two adjacent spacers.

In the display panel of the present disclosure, the planarization layer, the pixel defining layer, and the spacer are made of a photoresist material.

In addition, the present disclosure provides a display panel, comprising:
a substrate,
a thin film transistor (TFT) layer disposed on the substrate;
a planarization layer disposed on the TFT layer;
a pixel defining layer disposed on the planarization layer;
a light-emitting device layer disposed between two adjacent pixel defining layers, wherein the light-emitting device layer includes:
  an anode layer disposed on the pixel defining layer, wherein the anode layer covers a portion of the planarization layer and a portion of the pixel defining layer, and the anode layer is connected to a source/drain electrode via a through-hole;
  wherein the anode layer includes at least two anodes, and each of the anodes corresponds to a pixel unit of the display panel; and wherein each of the anodes includes a first portion contacting the planarization layer and a second portion contacting the pixel defining layer.

In the display panel of the present disclosure, an angle $\theta$ between the first portion and the second portion is between 0 degrees and 90 degrees.

In the display panel of the present disclosure, the display panel further includes a spacer disposed on the pixel defining layer, and each of the anodes is disposed between two adjacent spacers.

In the display panel of the present disclosure, the light-emitting device layer further includes a light-emitting layer disposed on the anode layer and a cathode layer disposed on the light-emitting layer, the light-emitting layer includes a plurality of light-emitting units, and each of the light-emitting units is disposed within an area covered by the anodes.

Furthermore, the present disclosure provides a display panel, comprising:
a substrate,
a thin film transistor (TFT) layer disposed on the substrate;
a planarization layer disposed on the TFT layer;
a pixel defining layer disposed on the planarization layer;
a light-emitting device layer disposed between two adjacent pixel defining layers, wherein the light-emitting device layer comprises:

an anode layer disposed on the pixel defining layer, wherein the anode layer covers a portion of the planarization layer and a portion of the pixel defining layer, and the anode layer is connected to a source/drain electrode via a through-hole.

In the display panel of the present disclosure, the display panel further includes a spacer disposed on the pixel defining layer, and each of the anodes is disposed between two adjacent spacers.

In the display panel of the present disclosure, the light-emitting device layer further includes a light-emitting layer disposed on the anode layer and a cathode layer disposed on the light-emitting layer, and the light-emitting layer includes a plurality of light-emitting units, and each of the light-emitting units is disposed within an area covered by the anodes.

According to the present disclosure, one mask is used to form the planarization layer and the pixel defining layer, or to form the planarization layer, the pixel defining layer, and the spacer. Thus, each of the light-emitting units is disposed within the area covered by the anode, and light emitted from the light-emitting unit can be reflected by the anode and be focused. Therefore, the risk where display panel has color mixing problem is decreased, and the intensity of light emitted therefrom is enhanced.

BRIEF DESCRIPTION OF THE SEVERAL VIEWS OF THE DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

Figure 1:
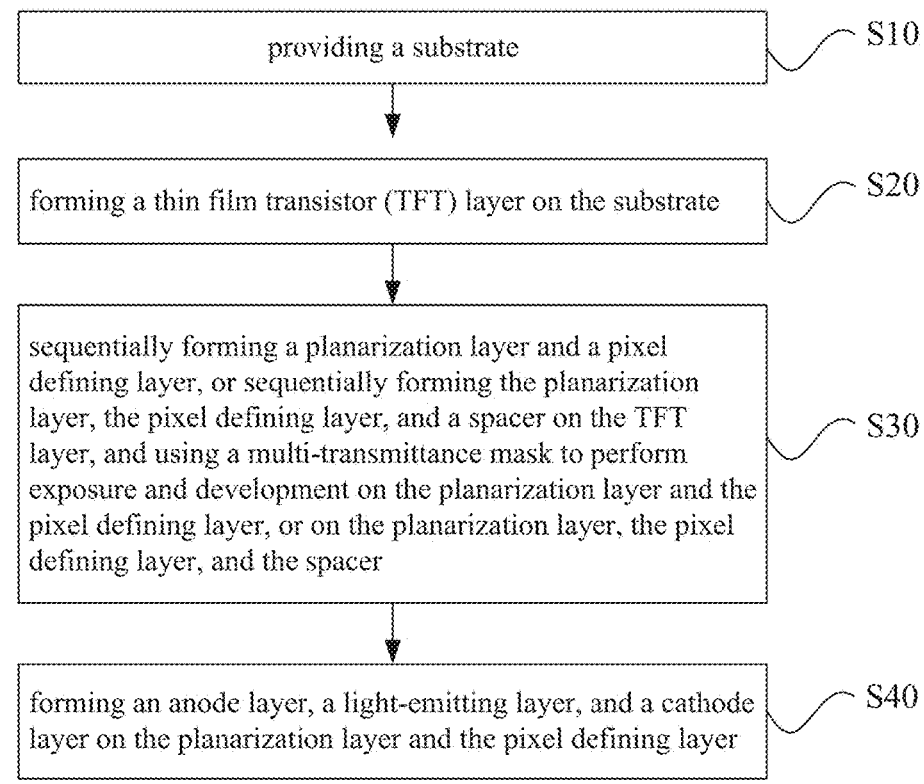
FIG. 1 shows a flowchart of a method for manufacturing a display panel according to a first embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

FIG. 1 shows a flowchart of a method for manufacturing a display panel according to a first embodiment of the present disclosure. The method for manufacturing the display panel includes the following steps.

In a step S10, a substrate is provided.

Specifically, the substrate 101 is provided. The substrate 101 could be a glass substrate, a quartz substrate, or a resin substrate.

In a step S20, a thin film transistor (TFT) layer is formed on the substrate.

Specifically, this step includes sequentially forming a buffer layer 102, an active layer 103, a first insulation layer 104, a first gate electrode 105, a second insulation layer 106, a second gate electrode 107, a third insulation layer 108, and a source/drain electrode 110 on the substrate 101.

Figure 2A:
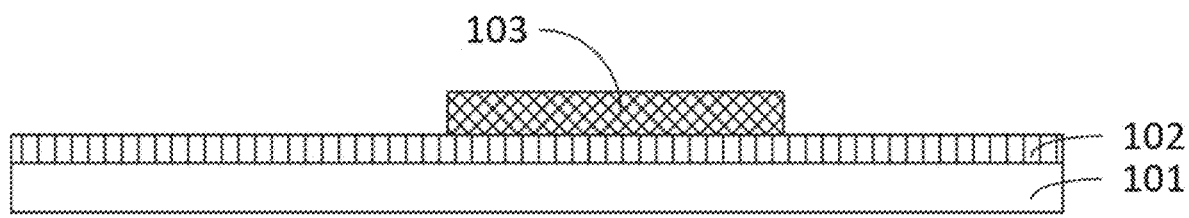
FIGS. 2A, 2B, 2C, 2D, 2E, 2F, 2G, 2H, 2I, and 2J are schematic diagrams showing different stages of the process of a method for manufacturing a display panel according to a first embodiment of the present disclosure.
Figure 2B:
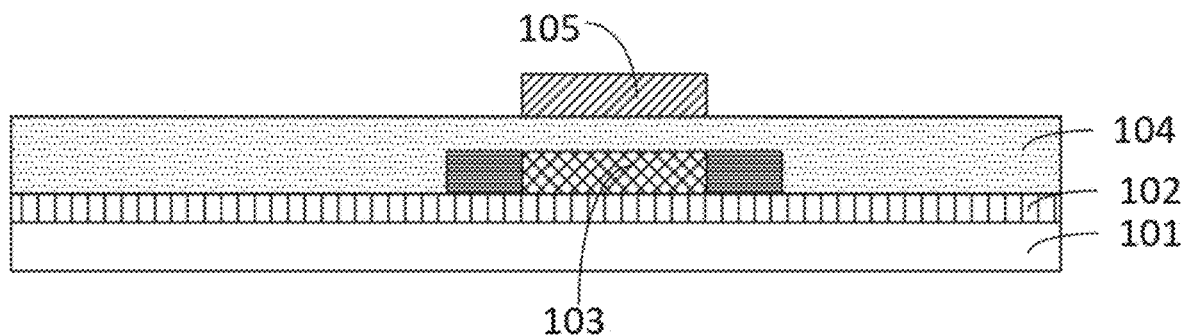

As shown in FIG. 2A, in the present embodiment, an active film is formed on the buffer layer 102 first. The active film is made of polysilicon. Then, a first mask process is performed on the active film. That is, a first photoresist layer (not shown) is formed on the active layer. After the first photoresist layer is exposed to light using a mask (not shown) and is developed, and a first etching treatment is performed thereon, the active film is patterned to have a pattern of the active layer 103, as shown in FIG. 2B. Thereafter, the first photoresist layer is removed.

As shown in FIG. 2B, the first insulation layer 104 is formed on the active layer 103. In the present embodiment, the first insulation layer 104 is an inter-layer insulation layer. The inter-layer insulation layer covers the active layer 103. The inter-layer insulation layer functions to isolate the active layer 103 from other metal layers.

As shown in FIG. 2B, a first metal layer is formed on the first insulation layer 104. The first metal layer is generally made of molybdenum, aluminum, aluminum/nickel alloy, molybdenum/tungsten alloy, chromium, copper, or any combination thereof.

A second mask process is performed on the first metal layer. That is, a second photoresist layer is formed on the first metal layer. After the second photoresist layer is exposed to light using a mask (not shown) and is developed, and a second etching treatment is performed thereon, the first metal layer is patterned to have a pattern of the first gate electrode 105, as shown in FIG. 2B. Thereafter, the second photoresist layer is removed.

As shown in FIG. 2B, ion implantation is performed on the active layer 103 to form doping areas. In the present embodiment, the ways of forming the doping areas are not limited to the method disclosed in the embodiment.

Figure 2C:
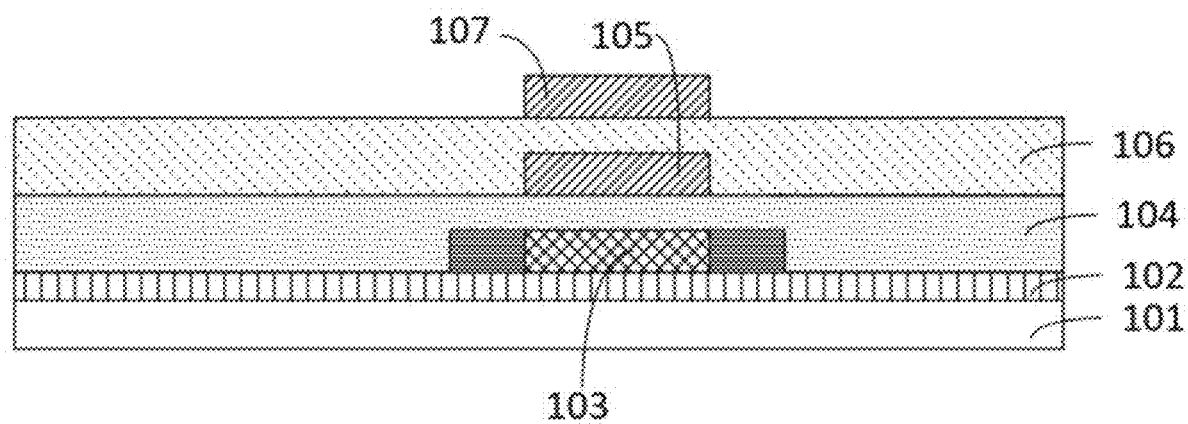

As shown in FIG. 2C, the second insulation layer 106 is a first gate insulation layer. The first gate insulation layer covers the active layer 103. The first gate insulation layer functions to isolate the first gate electrode 105 from the second gate electrode 107. Preferably, the first gate insulation layer is generally made of silicon nitride, or made of silicon oxide or silicon oxynitride.

As shown in FIG. 2C, the second gate electrode 107 and the first gate electrode 105 are made of a same metal. Generally, such metal includes molybdenum, aluminum, aluminum/nickel alloy, molybdenum/tungsten alloy, chromium, copper, or any combination thereof. In the present embodiment, the second gate electrode 107 is made of molybdenum, and the second gate electrode 107 has a thickness of 150-250 nm.

Figure 2D:
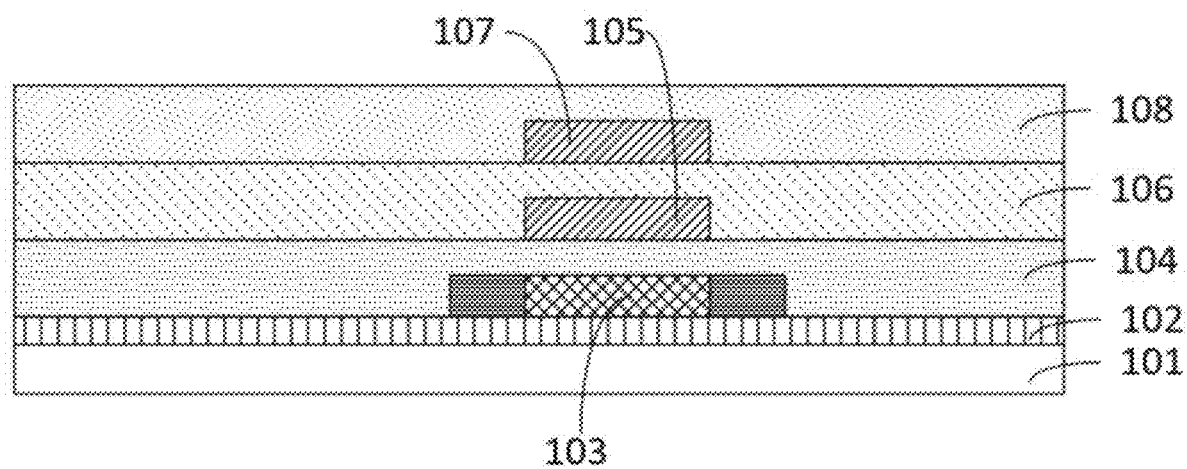

In this step, a third mask process is performed to form the second gate electrode 107. That is, a third photoresist layer is formed on the metal layer. After the third photoresist layer is exposed to light using a mask (not shown) and is developed, and a third etching treatment is performed thereon, the metal layer is patterned to have a pattern of the second gate electrode 107, as shown in FIG. 2D. Thereafter, the third insulation layer 108 is formed on the second gate electrode 107.

Figure 2E:
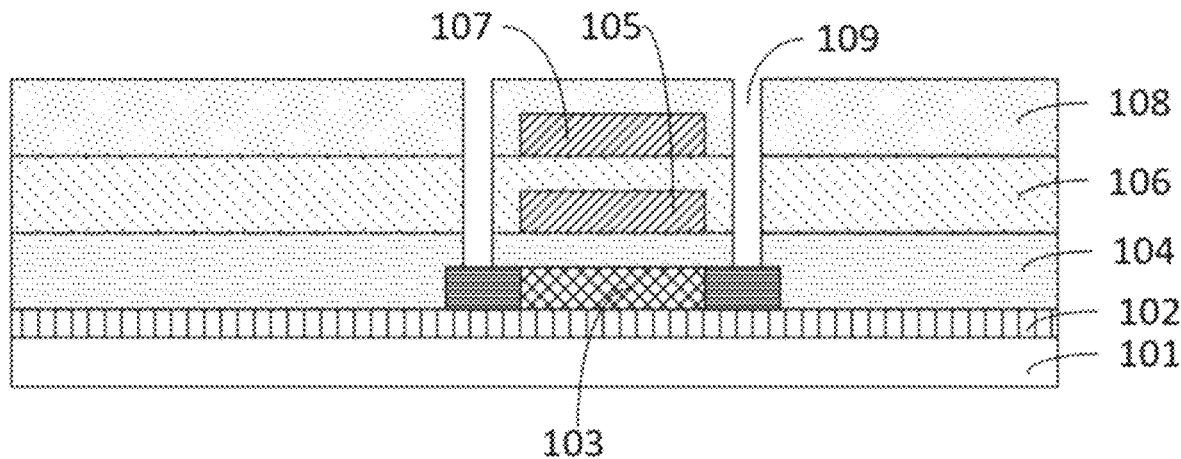

As shown in FIG. 2E, a first through-hole 109 is formed in the third insulation layer.

Figure 2F:
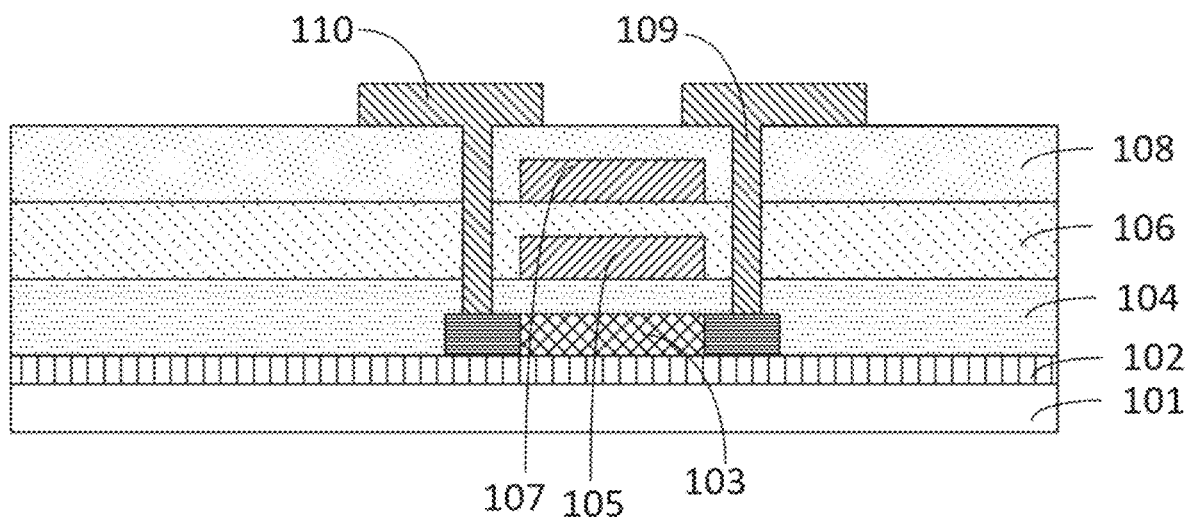
Figure 2G:
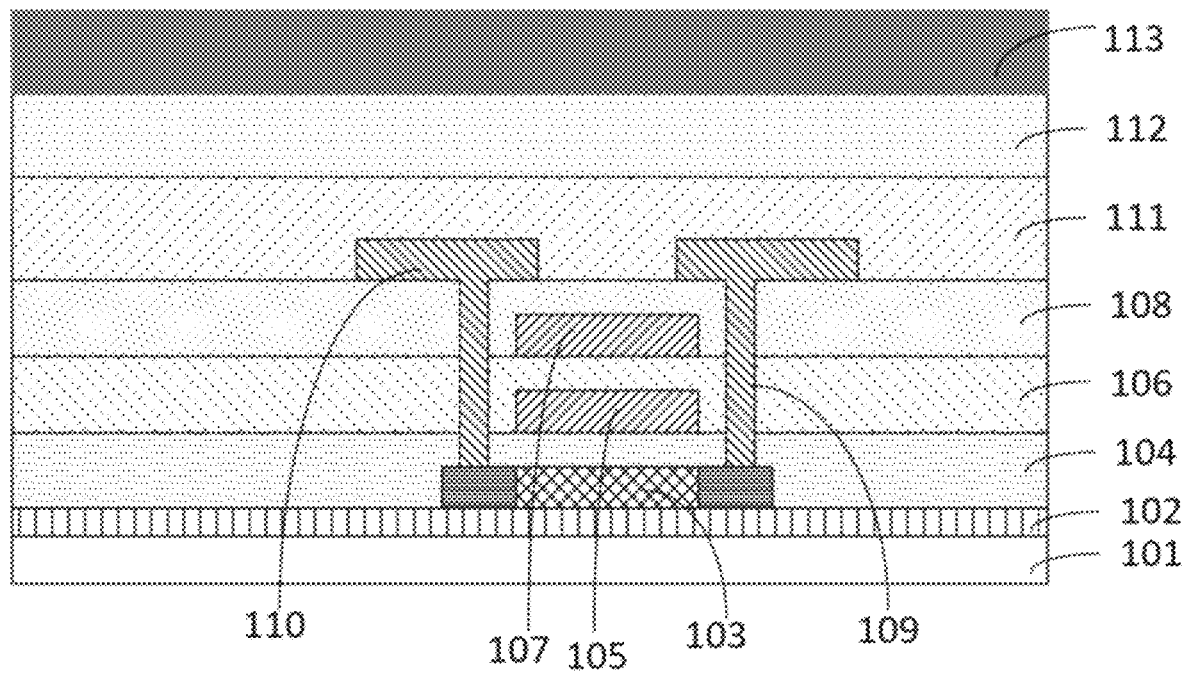

As shown in FIG. 2F, the source/drain electrode 110 is formed on the third insulation layer 108. The source/drain electrode 110, the first gate electrode 105, and the second gate electrode 107 could be made of a same metal. Generally, such metal includes molybdenum, aluminum, aluminum/nickel alloy, molybdenum/tungsten alloy, chromium, copper, or any combination thereof. In the present embodiment, the source/drain electrode 110 is made of titanium/aluminum/titanium, and the source/drain electrode 110 has a thickness of 400-600 nm.

A fourth mask process is performed to form the source/drain electrode 110. That is, a fourth photoresist layer is formed on the metal layer. After the forth photoresist layer is exposed to light using a mask (not shown) and is developed, and a forth etching treatment is performed thereon, the metal layer is patterned to have a pattern of the source/drain electrode 110.

The source/drain electrode 110 is connected to the doping areas via the through-hole 109.

In a step S30, a planarization layer and a pixel defining layer are sequentially formed on the TFT layer; or the planarization layer, the pixel defining layer, and a spacer are sequentially formed on the TFT layer. In addition, a multi-transmittance mask is used to perform exposure and development on the planarization layer and the pixel defining layer, or on the planarization layer, the pixel defining layer, and the spacer.

Figure 2H:
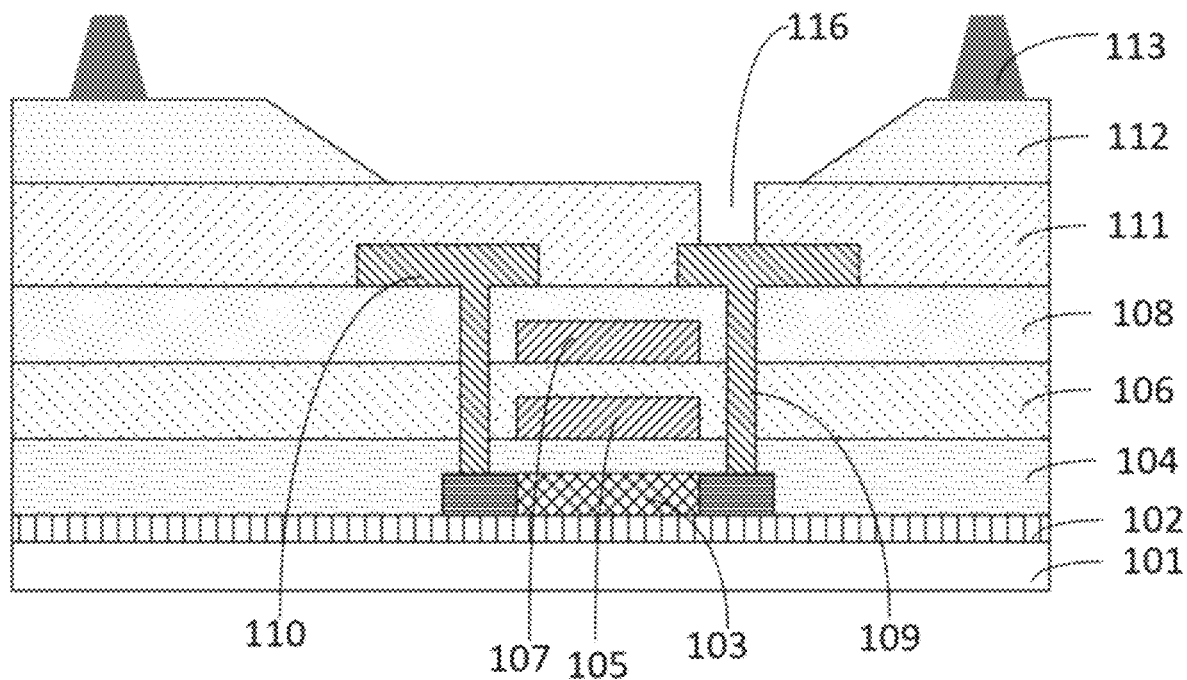

Specifically, the planarization layer 111 and the pixel defining layer 112 are sequentially formed on the source/drain electrode 110; or the planarization layer 111, the pixel defining layer 112, and the spacer 113 are sequentially formed on the source/drain electrode 110. In addition, the multi-transmittance mask is used to perform exposure and development on the planarization layer 111 and the pixel defining layer 112, or on the planarization layer 111, the pixel defining layer 112, and the spacer 113, so as to form a pattern as shown in FIG. 2H.

In the present embodiment, the planarization layer 111, the pixel defining layer 112, and the spacer 113 are all made of a photoresist material. Thus, the pattern could be formed using one mask. In addition, there is a second through-hole 116 formed in the planarization layer 111.

In a step S40, an anode layer, a light-emitting layer, and a cathode layer is formed on the planarization layer and the pixel defining layer.

Specifically, in this step, the anode layer is formed on the planarization layer 111 and the pixel defining layer 112 first. The anode covers a portion of the planarization layer 111 and a portion of the pixel defining layer 112. The anode layer is connected to the source/drain electrode 110 via the second-through hole 116.

The anode layer includes at least two anodes, and each of the anodes corresponds to a pixel unit of the display panel. And, each of the anodes is disposed between two adjacent spacers 113.

In the present embodiment, each of the anodes includes a first portion 114 contacting the planarization layer and a second portion 115 contacting the pixel defining layer. An angle θ between the first portion 114 and the second portion 115 is between 0 degrees and 90 degrees.

Figure 2I:
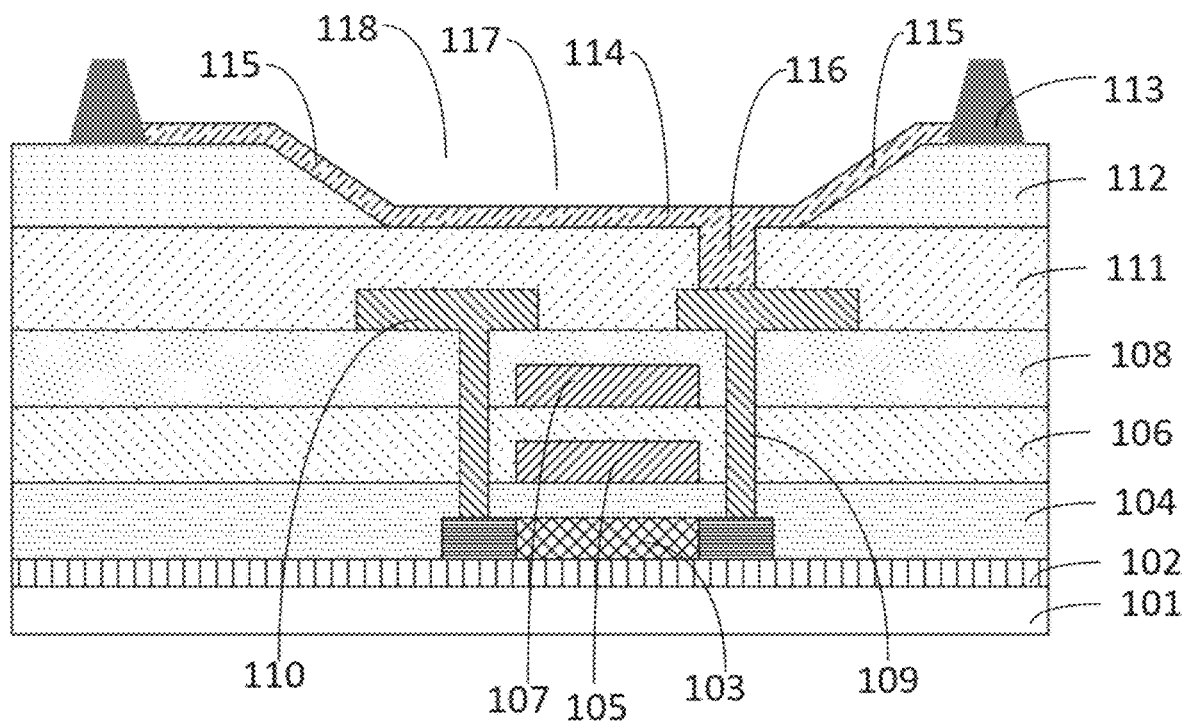

As shown in FIG. 2I, the second portion 115 includes a second parallel portion and a second tilt portion. The second parallel portion is parallel to the substrate 101, and an angel between the second tilt portion and the second parallel portion and an angel between the second tilt portion and the first portion 114 is θ.

Figure 2J:
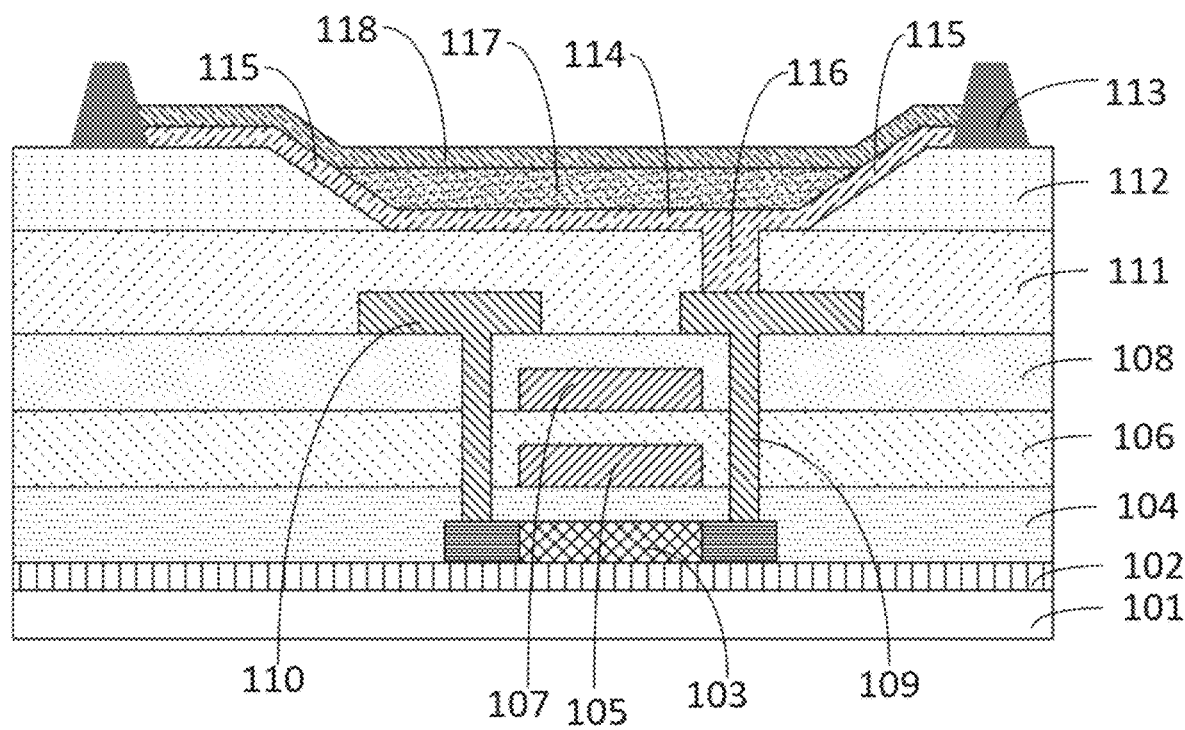

As shown in FIG. 2J, a light-emitting layer 117 is formed on the anode layer, and a cathode layer 118 is formed on the light-emitting layer 117. The light-emitting layer 117 includes at least two light-emitting units. Each of the light-emitting units is disposed within an area covered by the anode. That is, each of the light-emitting units is enclosed by the anode layer and the cathode layer 118.

Figure 3:
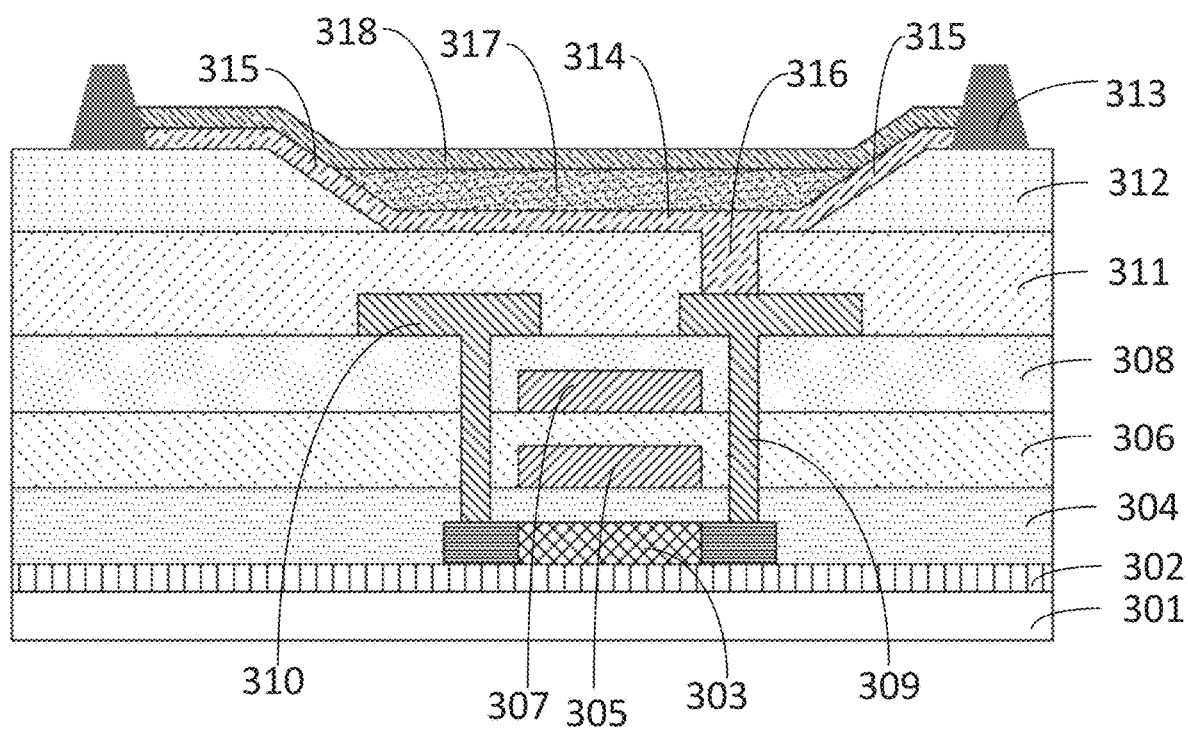
FIG. 3 is a schematic diagram showing a cross-sectional view of a structure of a display panel according to a second embodiment of the present disclosure.

FIG. 3 is a schematic diagram showing a cross-sectional view of a structure of a display panel according to a second embodiment of the present disclosure. The display panel includes a substrate 301, a thin film transistor (TFT) layer, a planarization layer 311, a pixel defining layer 312, and a light-emitting device layer.

The substrate 301 could be a glass substrate, a quartz substrate, or a resin substrate.

The TFT layer includes a buffer layer 302, an active layer 303, a first insulation layer 304, a first gate electrode 305, a second insulation layer 306, a second gate electrode 307, a third insulation layer 308, and a source/drain electrode 310.

The buffer layer 302 is disposed on the substrate 301 to function as a buffer in response to pressure between film structures, and the buffer layer 302 has a water/oxygen blocking function.

The active layer 303 is disposed on the buffer layer. The active layer 303 includes doping areas that are doped by ion implantation.

The first insulation layer 304 is disposed on the active layer 303. In the present embodiment, the first insulation layer 304 is an inter-layer insulation layer. The inter-layer insulation layer covers the active layer 303. The inter-layer insulation layer functions to isolate the active layer 303 from other metal layers.

The first gate electrode 305 is disposed on the first insulation layer 104. The first gate electrode 305 is generally made of molybdenum, aluminum, aluminum/nickel alloy, molybdenum/tungsten alloy, chromium, copper, or any combination thereof.

The second insulation layer 306 is disposed on the first gate electrode 305. In the present embodiment, the second insulation layer 306 is a first gate insulation layer. The first gate insulation layer covers the active layer 303. The first gate insulation layer functions to isolate the first gate electrode 305 from the second gate electrode 307. Preferably, the first gate insulation layer 306 has a thickness of 50-200 nm. The first gate insulation layer 306 is generally made of silicon nitride, or made of silicon oxide or silicon oxynitride.

The second gate electrode 307 is disposed on the second insulation layer 306. The second gate electrode 307 and the first gate electrode 305 are made of a same metal. Preferably, in the present embodiment, the second gate electrode 307 and the first gate electrode 305 are made of molybdenum.

In addition, the metal layer that is used to form the second gate electrode 307 is patterned, so as to form the second gate electrode 307 having an area greater than the area of the first gate electrode 305. In other words, a projection of the first gate electrode 305 on the second gate electrode 307 is within the second gate electrode 307.

The third insulation layer 308 is disposed on the second insulation layer 306. In the present embodiment, the third insulation layer 308 is a second gate insulation layer. The second gate insulation layer covers the second gate electrode 307. The second gate insulation layer functions to isolate the second gate electrode 307 from the source/drain electrode 310. Preferably, the second gate insulation layer 308 has a thickness of 50-200 nm. The second gate insulation layer and the first gate insulation layer are made of a same material.

The source/drain electrode 310 is disposed on the third insulation layer 308. The source/drain electrode 310 is generally made of a metal, such as molybdenum, aluminum, aluminum/nickel alloy, molybdenum/tungsten alloy, chromium, copper, aluminum/titanium alloy, or any combination thereof. Preferably, in the present embodiment, the source/drain electrode 310 is made of aluminum/titanium alloy. The source/drain electrode 310 is connected to the doping areas via the first through-hole 309.

The planarization layer 311, the pixel defining layer 312, and the spacer 313 are formed on the source/drain electrode 310. Additionally, the planarization layer 311, the pixel defining layer 312, and the spacer 313 are made of a photoresist material. Thus, such pattern could be formed using one mask.

The light-emitting device layer is disposed on the planarization layer 311, and is disposed between two adjacent pixel defining layers 312. The light-emitting device layer includes an anode layer, a light-emitting layer 317, and a cathode layer 318. The anode layer is disposed on the pixel defining layer 312 and the planarization layer 311, wherein the anode layer is connected to the source/drain electrode 310 via a second through-hole 316. In the present embodiment, the anode layer includes at least two anodes, each of the anodes corresponds to a pixel unit of the display panel. Each of the anodes is disposed between two adjacent spacers 313.

In the present embodiment, each of the anodes includes a first portion 314 contacting the planarization layer and a second portion 135 contacting the pixel defining layer. An angle θ between the first portion 134 and the second portion 135 is between 0 degrees and 90 degrees.

As shown in FIG. 2I, the second portion 315 includes a second parallel portion and a second tilt portion. The second parallel portion is parallel to the substrate 301, and an angel between the second tilt portion and the second parallel portion and an angel between the second tilt portion and the first portion 314 is θ.

The light-emitting layer 317 is disposed on the anode layer. The light-emitting layer 317 includes at least two light-emitting units. Each of the light-emitting units is disposed within an area covered by the anode.

The cathode layer 318 is disposed on the light-emitting layer 317.

The present disclosure provides a display panel and a method for manufacturing the same. According to the present disclosure, one mask is used to form the planarization layer and the pixel defining layer, or to form the planarization layer, the pixel defining layer, and the spacer. Thus, each of the light-emitting units is disposed within the area covered by the anode, and light emitted from the light-emitting unit can be reflected by the anode and be focused. Therefore, the risk where display panel has color mixing problem is decreased, and the intensity of light emitted therefrom is enhanced.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a display panel, comprising:
    a step S10 of providing a substrate;
    a step S20 of forming a thin film transistor (TFT) layer on the substrate;
    a step S30 of sequentially forming a planarization layer, a pixel defining layer, and a spacer on the TFT layer, and using a multi-transmittance mask to perform exposure and development on the planarization layer, the pixel defining layer, and the spacer, wherein the planarization layer, the pixel defining layer, and the spacer are made of a photoresist material, and a pattern of the planarization layer, the pixel defining layer, and the spacer is formed using the multi-transmittance mask;
    a step S40 of forming an anode layer, a light-emitting layer, and a cathode layer on the planarization layer and the pixel defining layer;
    wherein the anode layer covers a portion of the planarization layer and a portion of the pixel defining layer, and the anode layer is connected to a source/drain electrode via a through-hole.

2. The method for manufacturing the display panel according to claim 1, wherein the anode layer includes at least two anodes, and each of the anodes corresponds to a pixel unit of the display panel; and
    wherein each of the anodes includes a first portion contacting the planarization layer and a second portion contacting the pixel defining layer.

3. The method for manufacturing the display panel according to claim 2, wherein an angle θ between the first portion and the second portion is between 0 degrees and 90 degrees.

4. The method for manufacturing the display panel according to claim 1, wherein each of the anodes is disposed between two adjacent spacers.

5. A display panel, comprising:
    a substrate,
    a thin film transistor (TFT) layer disposed on the substrate;
    a planarization layer disposed on the TFT layer;
    a pixel defining layer disposed on the planarization layer;
    a spacer disposed on the pixel defining layer;
    a light-emitting device layer disposed between two adjacent pixel defining layers and two adjacent spacers, wherein the planarization layer, the pixel defining layer, and the spacer are made of a photoresist material, and a pattern of the planarization layer, the pixel defining layer, and the spacer is formed using one mask, and wherein the light-emitting device layer includes:
    an anode layer disposed on the pixel defining layer, wherein the anode layer covers a portion of the planarization layer and a portion of the pixel defining layer, and the anode layer is connected to a source/drain electrode via a through-hole;
    wherein the anode layer includes at least two anodes, and each of the anodes corresponds to a pixel unit of the display panel; and wherein each of the anodes includes a first portion contacting the planarization layer and a second portion contacting the pixel defining layer.

6. The display panel according to claim 5, wherein an angle θ between the first portion and the second portion is between 0 degrees and 90 degrees.

7. The display panel according to claim 5, wherein the light-emitting device layer further includes a light-emitting layer disposed on the anode layer and a cathode layer disposed on the light-emitting layer; and wherein the light-emitting layer includes a plurality of light-emitting units, and each of the light-emitting units is disposed within an area covered by the anodes.

8. A display panel, comprising:
a substrate,
a thin film transistor (TFT) layer disposed on the substrate;
a planarization layer disposed on the TFT layer;
a pixel defining layer disposed on the planarization layer;
a spacer disposed on the pixel defining layer;
a light-emitting device layer disposed between two adjacent pixel defining layers and two adjacent spacers, wherein the planarization layer, the pixel defining layer, and the spacer are made of a photoresist material, and a pattern of the planarization layer, the pixel defining layer, and the spacer is formed using one mask, and wherein the light-emitting device layer comprises:
an anode layer disposed on the pixel defining layer, wherein the anode layer covers a portion of the planarization layer and a portion of the pixel defining layer, and the anode layer is connected to a source/drain electrode via a through-hole.

9. The display panel according to claim 8, wherein the light-emitting device layer further includes a light-emitting layer disposed on the anode layer and a cathode layer disposed on the light-emitting layer; and
wherein the light-emitting layer includes a plurality of light-emitting units, and each of the light-emitting units is disposed within an area covered by the anodes.

* * * * *